United States Patent
Jing et al.

(10) Patent No.: US 10,847,604 B1
(45) Date of Patent: Nov. 24, 2020

(54) SYSTEMS AND METHODS FOR PROVIDING CAPACITOR STRUCTURES IN AN INTEGRATED CIRCUIT

(71) Applicant: Xilinx, Inc., San Jose, CA (US)

(72) Inventors: Jing Jing, San Jose, CA (US); Shuxian Wu, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 37 days.

(21) Appl. No.: 15/707,552

(22) Filed: Sep. 18, 2017

(51) Int. Cl.
*H01L 23/522* (2006.01)
*H01L 49/02* (2006.01)
*H01L 27/08* (2006.01)

(52) U.S. Cl.
CPC .......... *H01L 28/56* (2013.01); *H01L 23/5223* (2013.01); *H01L 27/0805* (2013.01); *H01L 28/86* (2013.01); *H01L 28/88* (2013.01); *H01L 28/90* (2013.01); *H01L 28/92* (2013.01)

(58) Field of Classification Search
CPC ........... H01L 28/82–92; H01L 23/5223; H01L 27/0805; H01L 28/56; H01L 28/40–92; H01L 23/5222–5226; H05B 2203/006; H01G 4/01–012
See application file for complete search history.

(56) References Cited

U.S. PATENT DOCUMENTS

| | | | |
|---|---|---|---|
| 9,524,964 B2 | 12/2016 | Jing et al. | |
| 2014/0092523 A1* | 4/2014 | Zhu | H01L 28/86 361/303 |
| 2014/0367827 A1* | 12/2014 | Lee | H01L 23/5223 257/532 |
| 2016/0049393 A1* | 2/2016 | Jing | H01L 27/0805 257/532 |

\* cited by examiner

*Primary Examiner* — Nelson Garces
(74) *Attorney, Agent, or Firm* — Patterson + Sheridan, LLP

(57) ABSTRACT

A capacitor includes a first metal layer over a substrate, a second metal layer over the first metal layer, and first and second cells. Each cell is electrically coupled to first and second buses. Each cell includes first plurality and second plurality of fingers in the first metal layer, and third plurality and fourth plurality of fingers in the second metal layer. The first plurality of fingers extend in a first direction parallel to a top surface of the substrate and are electrically coupled to the first bus. The second plurality of fingers extend in the first direction and are electrically coupled to the second bus. The third plurality of fingers extend in a second direction parallel to the top surface of the substrate and are electrically coupled to the first bus. The second direction is different from the first direction. The fourth plurality of fingers extend in the second direction and are electrically coupled to the second bus.

21 Claims, 14 Drawing Sheets

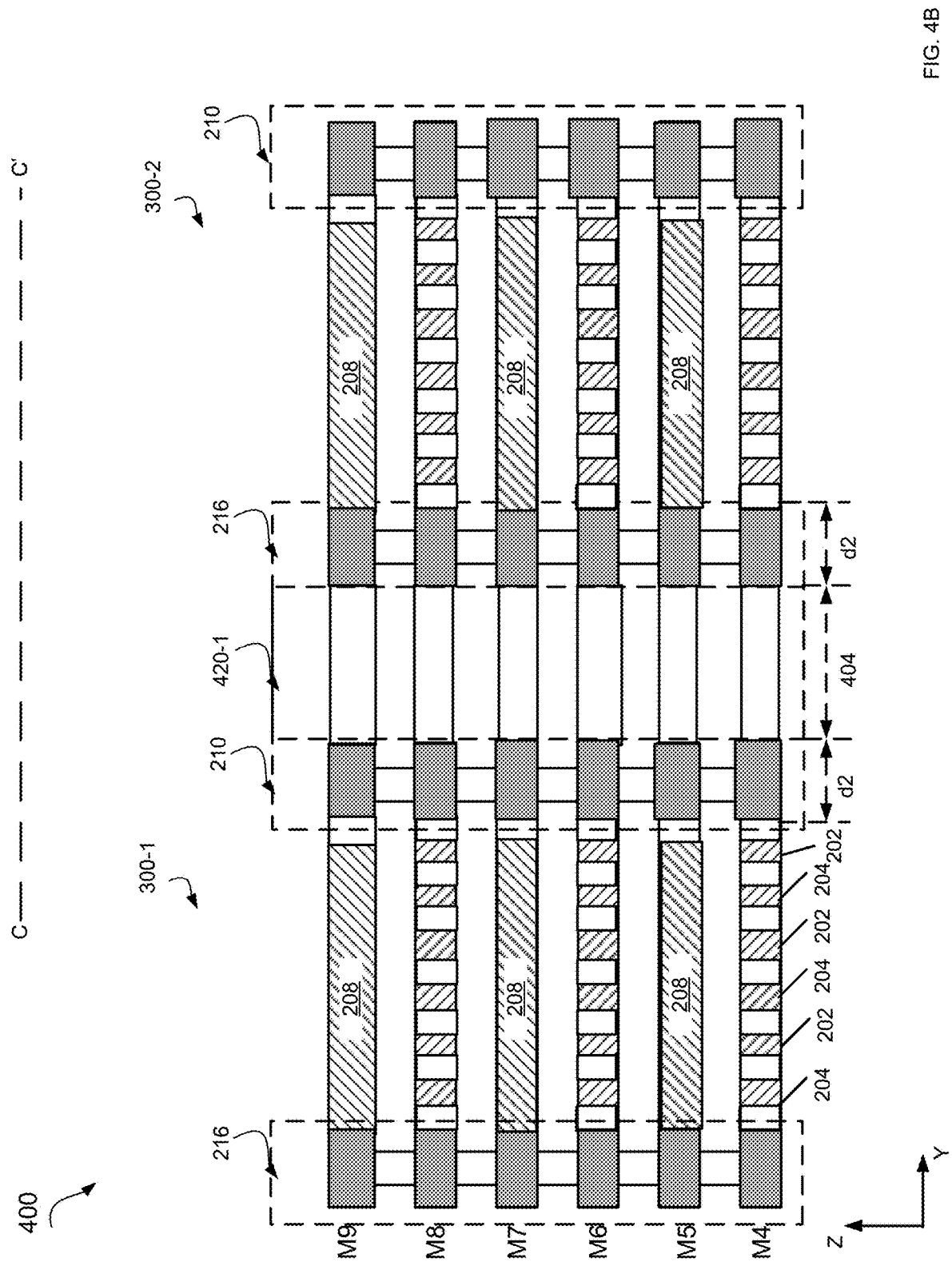

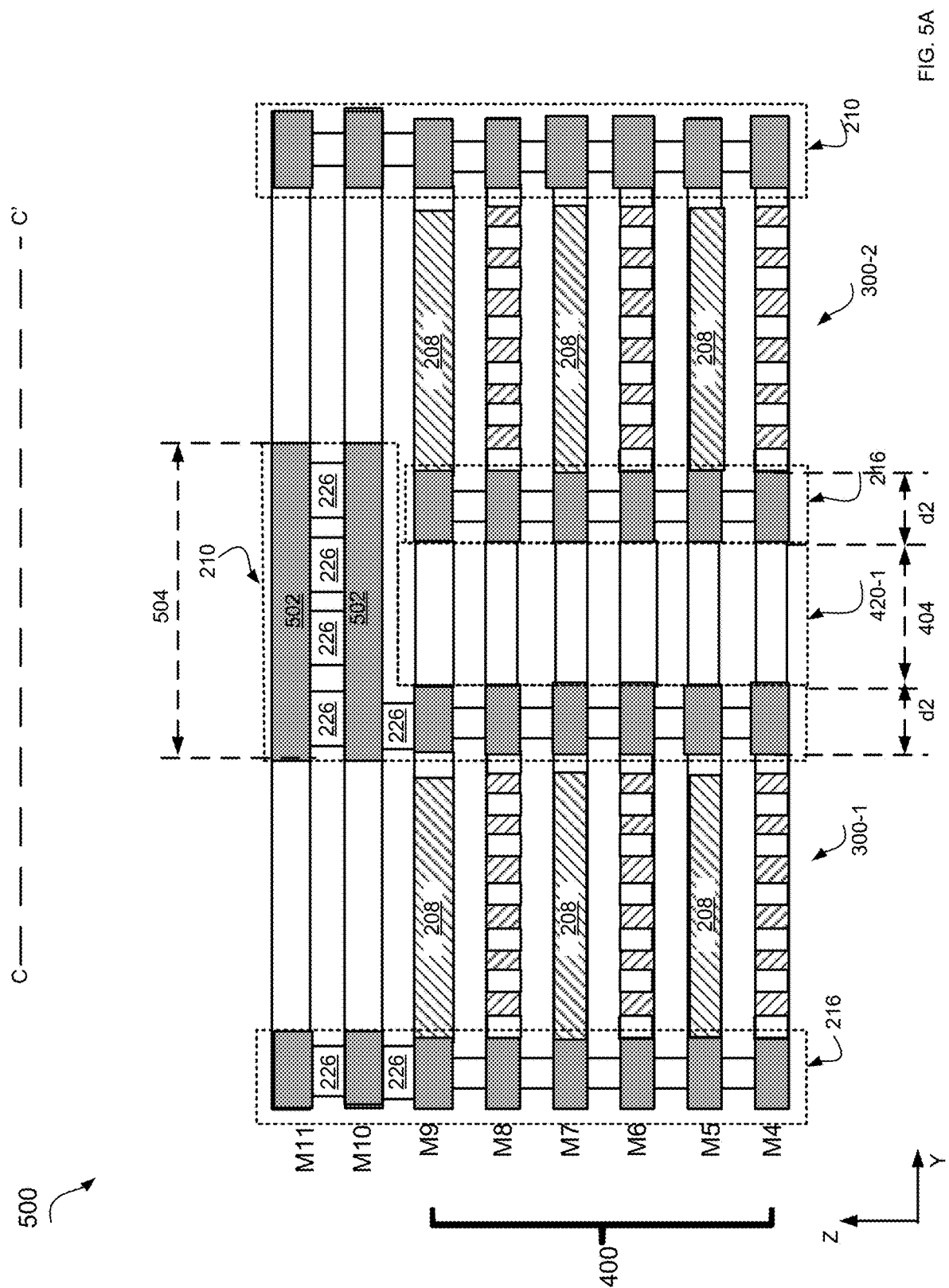

600

Form a first metal layer of a plurality of cells of a finger capacitor, wherein for each cell, the first metal layer includes a first plurality of fingers extending in a first direction and coupled to a first bus, and a second plurality of fingers extending in the first direction and coupled to a second bus
602

Form a second metal layer of the plurality of cells over the first metal layer, wherein for each cell, the second metal layer includes a third plurality of fingers extending in a second direction and coupled to the first bus, and a fourth plurality of fingers extending in the second direction and coupled to the second bus
604

Form a third metal layer over the second metal layer, where the third metal layer includes portions of the first and second buses and does not include fingers of the finger capacitor
606

FIG. 6

SYSTEMS AND METHODS FOR PROVIDING CAPACITOR STRUCTURES IN AN INTEGRATED CIRCUIT

TECHNICAL FIELD

Examples of the present disclosure generally relate to integrated circuits (ICs) and, in particular, to an embodiment related to systems and methods for providing capacitor structures in integrated circuits.

BACKGROUND

Capacitors are used in integrated circuits (ICs) for a variety of purposes. Metal finger capacitors ("finger capacitors") are example capacitor structures used in ICs. An LC tank or resonator is one type of circuit integrated in an IC that can utilize a finger capacitor. Finger capacitor designs are critical for achieving high LC tank performance. As the semiconductor industry progresses into nanometer technology process nodes in pursuit of higher device density, higher performance, and lower cost, providing a high quality factor (Q) in finger capacitors in the IC has proven challenging. As the semiconductor device fabrication node becomes smaller, the quality factor of a finger capacitor may degrade because of various restrictions in the semiconductor device fabrication technology, including, for example, metal routing restrictions, metal coloring requirements, and increased metal resistances.

Accordingly, there is a need for improved systems and methods for providing capacitors.

SUMMARY

In some embodiments in accordance with the present disclosure, a capacitor includes a first metal layer over a substrate; a second metal layer over the first metal layer; and first and second cells. Each cell is electrically coupled to first and second buses. Each cell includes a first plurality of fingers in the first metal layer extending in a first direction parallel to a top surface of the substrate and electrically coupled to the first bus; a second plurality of fingers in the first metal layer extending in the first direction and electrically coupled to the second bus; a third plurality of fingers in the second metal layer extending in a second direction parallel to the top surface of the substrate and electrically coupled to the first bus, the second direction being different from the first direction; and a fourth plurality of fingers in the second metal layer extending in the second direction and electrically coupled to the second bus.

In some embodiments, the capacitor includes a first row including the first and second cells aligned in the first direction, wherein a first portion of the first bus interposes the first and second cells.

In some embodiments, each finger of the first plurality of fingers of the first cell physically contacts one of two opposing sidewalls the first portion of the first bus, and each finger of the first plurality of fingers of the second cell physically contacts the other of the two opposing sidewalls of the first portion of the first bus.

In some embodiments, the first row includes a third cell aligned with the first and second cells in the first direction. A second portion of the second bus interposes the second and third cells. Each finger of the second plurality of fingers of the second cell physically contacts one of two opposing sidewalls of the second portion of the second bus. Each finger of the second plurality of fingers of the third cell physically contacts the other of the two opposing sidewalls of the second portion of the second bus.

In some embodiments, the capacitor includes a second row including third and fourth cells. The third and fourth cells are aligned in the first direction. The second row is aligned with the first row in the second direction.

In some embodiments, a second portion of the second bus interposes the first row and the second row.

In some embodiments, the capacitor includes a third metal layer over the second metal layer, the third metal layer including a second portion of the second bus disposed directly over a first portion of the first cell.

In some embodiments, the second portion of the second bus in the third metal layer is disposed directly over the first, second, third, and fourth cells.

In some embodiments, the third metal layer includes a third portion of the first bus disposed directly over a second portion of the first cell.

In some embodiments, each finger of each cell has a first width equals to a minimum metal line width for fabrication of the capacitor.

In some embodiments, a distance between first and second fingers of the first plurality of fingers is equal to a minimum spacing size for the fabrication of the capacitor.

In some embodiments, a first portion of the first bus interposing the first and second cells has a second width greater than the first width.

In some embodiments, in each cell, each of a first total number of the first plurality and second plurality of fingers and a second total number of the third plurality and fourth plurality of fingers is less than 10.

In some embodiments, the capacitor includes a third metal layer over the second metal layer. Each cell includes a fifth plurality of fingers in the third metal layer extending in the first direction and electrically coupled to the first bus; and a sixth plurality of fingers in the third metal layer extending in the first direction and electrically coupled to the second bus.

In some embodiments, a method includes forming a first metal layer over a substrate and forming a second metal layer over the first layer. The forming the first metal layer includes for each cell of first and second cells of a capacitor electrically coupled to first and second buses, forming a first plurality of fingers extending in a first direction and electrically coupled to the first bus; and for each cell, forming a second plurality of fingers extending in the first direction and electrically coupled to the second bus. The forming the second metal layer includes for each cell, forming a third plurality of fingers extending in a second direction and electrically coupled to the first bus, the second direction being different from the first direction; and for each cell, forming a fourth plurality of fingers extending in the second direction and electrically coupled to the second bus.

In some embodiments, the method includes forming a first portion of the first bus interposing first and second cells, wherein the first and second cells are disposed in a first row and aligned in the first direction.

In some embodiments, the method includes forming a second row including third and fourth cells. The third and fourth cells are aligned in the first direction. The second row is aligned with the first row in the second direction.

Other aspects and features will be evident from reading the following detailed description and accompanying drawings.

BRIEF DESCRIPTION OF THE DRAWINGS

FIG. 4B is a block diagram illustrating a cross-sectional view of the semiconductor device of FIG. 4A according to some embodiments of the present disclosure.

FIG. 5A is a block diagram illustrating a cross-sectional view of a semiconductor device or a portion thereof according to some embodiments of the present disclosure.

FIG. 6 is a flow diagram illustrating a method to fabricate a semiconductor device according to some embodiments of the present disclosure.

DETAILED DESCRIPTION

Figure 1:
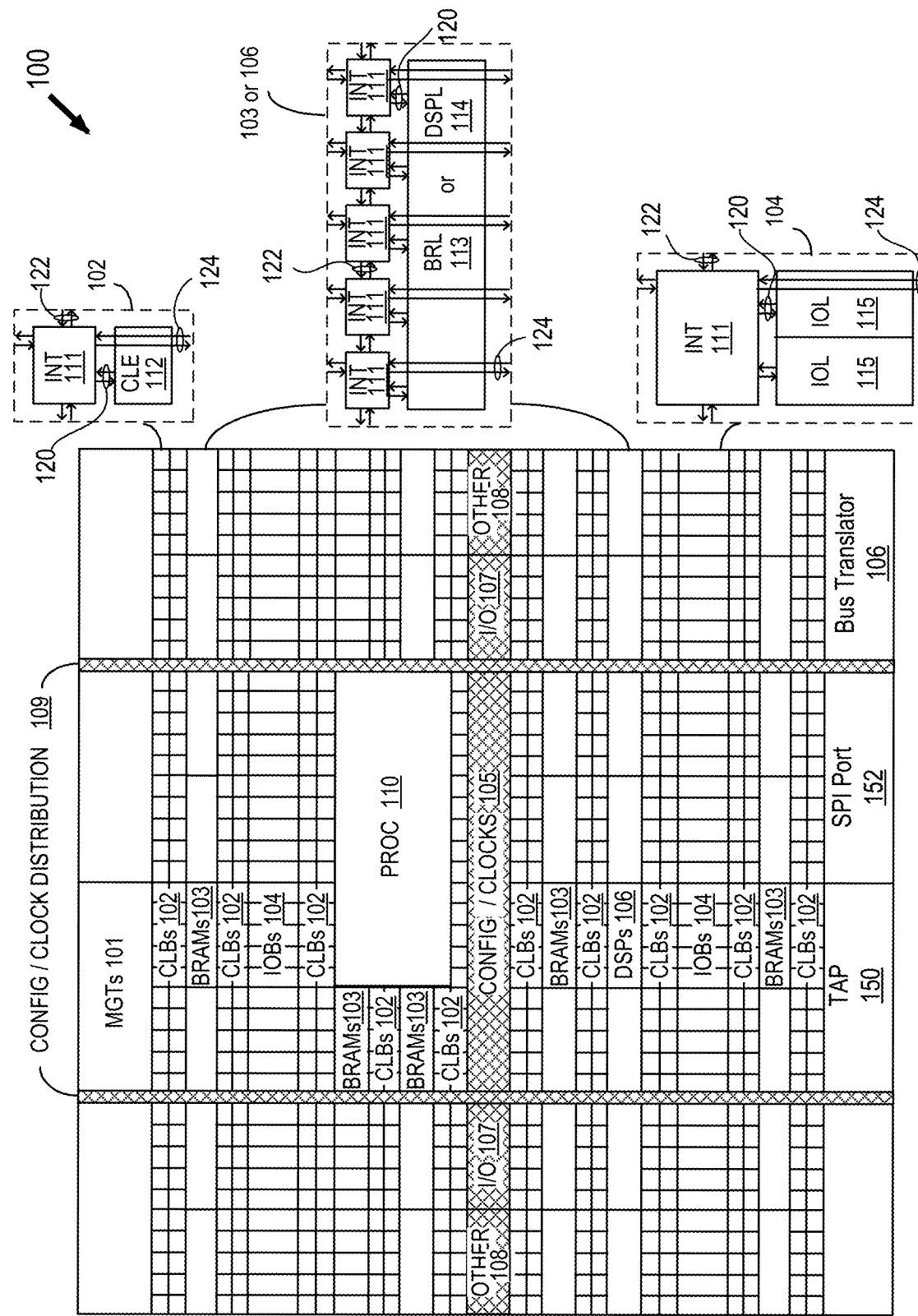
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, as the semiconductor device fabrication node becomes smaller, the quality factor of a finger capacitor may degrade, making it challenging to meet the quality factor requirement for high frequency (e.g., greater than 20 GHz) voltage controlled oscillator (VCO) designs. For example, for technology nodes less than 10 nm, unidirectional metal layers may be required. The quality factor of a finger capacitor is degraded because of such metal routing restrictions, along with metal coloring requirements and increased metal resistances. To address these challenges, in some embodiments, the finger capacitor design may use a non-minimum metal pitch rule, where fingers of the finger capacitor have a width greater than the minimum metal pitch size. However, such a finger capacitor design increases the chip area used by the finger capacitor, and introduces more parasitic. For example, it requires much wider metal lines (fingers) and larger spacing between adjacent fingers to balance the bi-directional routing. As such, finger capacitor designs with the non-minimum pitch rule lose the technology scaling benefit. This may result in finger capacitors having a big size that may be even larger than the finger capacitors with the same capacitance in the previous generations (e.g., 16 nm technology nodes) that do not have the unidirectional metal layer requirements. For further example, in such embodiments, the capacitance of the finger capacitor is reduced due to the larger spacing between adjacent fingers. The larger size of the finger capacitor, in turn, degrades the quality factor of the finger capacitor because it requires longer bus lines and metal routing. Alternatively, in some embodiments where fingers have a width of the minimum pitch size, those fingers may have very high length-to-width ratios (e.g., greater than 50:1) so that more fingers may be added to a finger capacitor to increase its capacitance. However, those fingers with high length-to-width ratios may have very high parasitic resistance. As such, the current passing through those fingers may degrade the quality factor of the finger capacitor dramatically.

For integrated circuit (IC) solutions, it has been discovered that using a plurality of cells to form a finger capacitor may reduce parasitic resistance and improve the quality factor of the finger capacitor. In some examples, such implementations may improve finger cap quality factor drastically (e.g., by more than 70%) compared to implementations using fingers that extend the entire width and/or length of the finger capacitor. With the above general understanding borne in mind, various embodiments for providing a capacitor are generally described below.

Various advantages may be present in various applications of the present disclosure. No particular advantage is required for all embodiments, and different embodiments may offer different advantages. One of the advantages of some embodiments is that by repeating cells in rows and/or columns to form a finger capacitor, the cells may be connected using wider buses. This allows current to go through the wider buses instead of the narrow long metal lines (fingers) inside the finger capacitor, which reduces parasitic resistance and avoid quality factor degradation. Another advantage of some embodiments is that perpendicular buses in metal layers may be used to connect alternate metal layers for each cell. As such, each cell of the finger capacitor may include fingers in odd unidirectional metal layers extending in a first direction and fingers in even unidirectional metal layers extending in a second direction, where fingers following the minimum metal pitch rule may be used. Yet another advantage of some embodiments is that the buses may include additional metal layers that are different from (e.g., over and/or under) the metal layers of the finger capacitor, which further reduce the parasitic resistance and improves the quality factor of the finger capacitor. Yet another advantage of some embodiments that by expanding the width and height of the buses using additional metal layers over the metal layers of the finger capacitor, the parasitic resistance of the finger capacitor is reduced without adding extra parasitic capacitance because those additional metal layers are shielded by the underlying metal layers of the finger capacitor.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may incorporate the semiconductor devices including the capacitors is not limited to the exemplary IC depicted in FIG. 1, and that IC having other configurations, or other types of IC, may also include the capacitors.

Figure 2A:
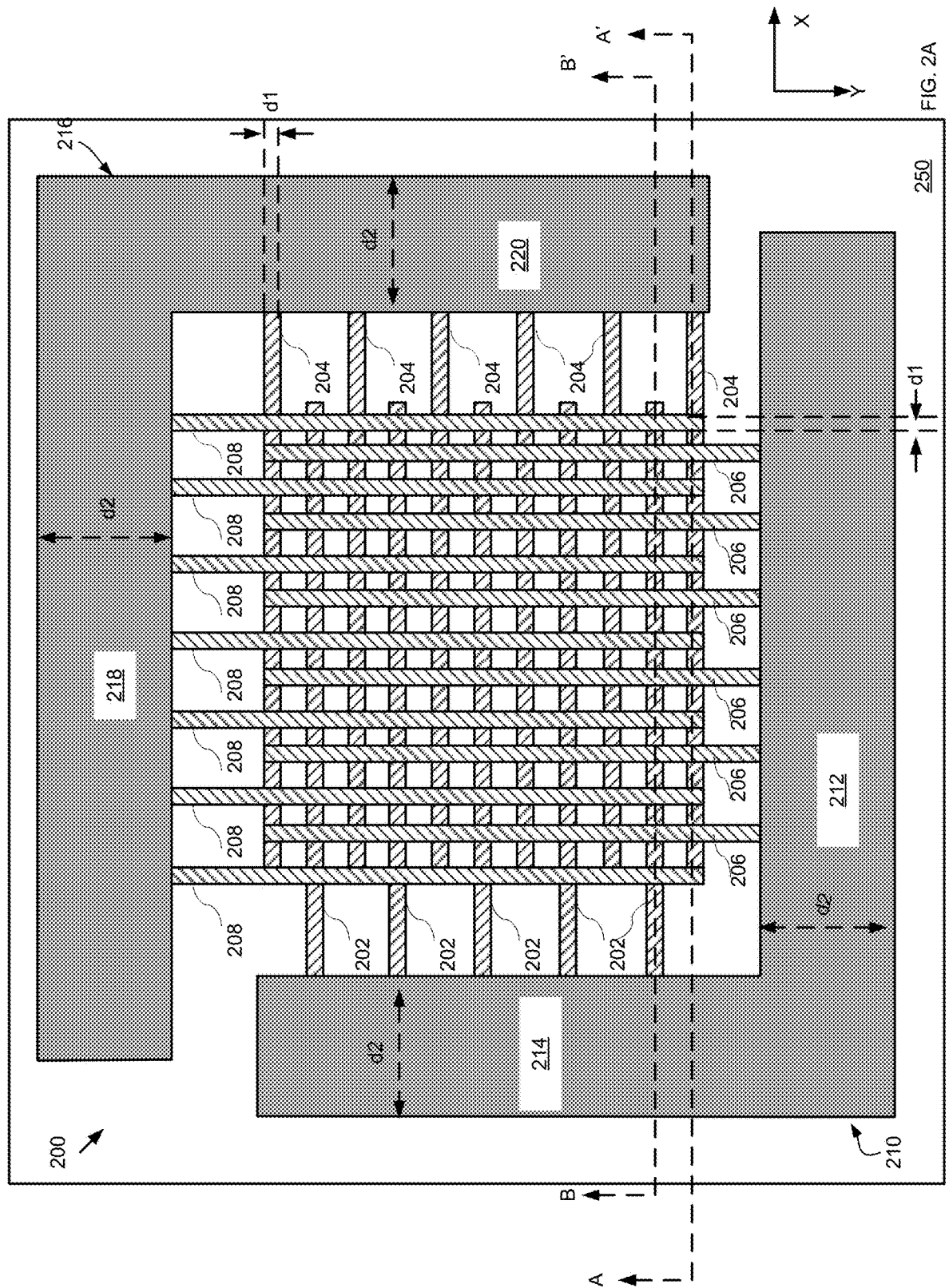
FIG. 2A is a block diagram illustrating a top view of a semiconductor device according to some embodiments of the present disclosure.

Referring to FIGS. 2A through 6, systems and methods for providing a capacitor using a plurality of cells are described. Referring to FIGS. 2A, 2B, and 2C, a top view and cross-sectional views of a cell 200 are illustrated. FIG. 2A is a top view of the cell 200 in a semiconductor device 250, FIG. 2B is a cross-sectional view along line A-A' of the semiconductor device 250, and FIG. 2C is a cross-sectional view along line B-B' of the semiconductor device 250.

Figure 2B:
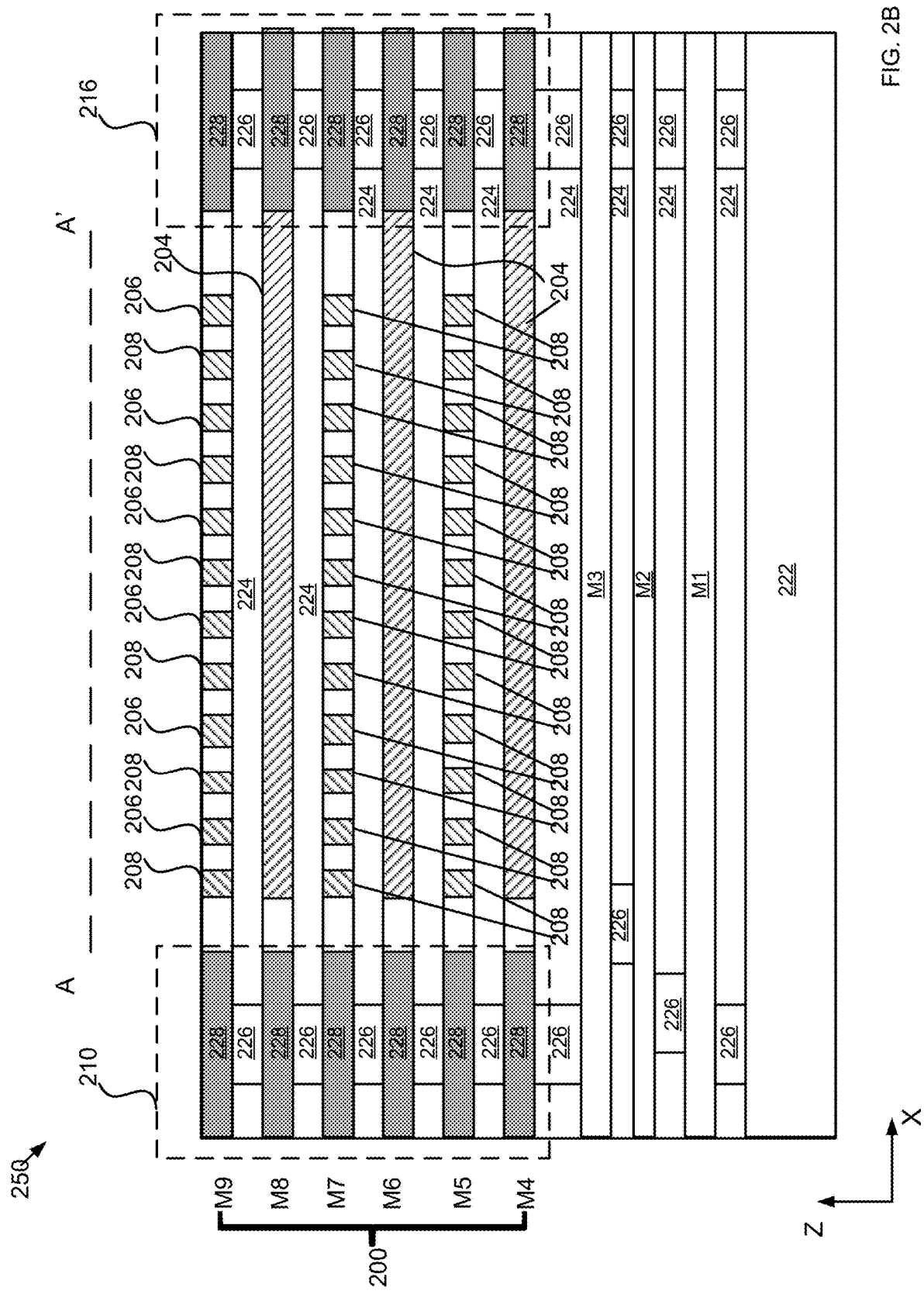
FIG. 2B is a block diagram illustrating a cross-sectional view of the semiconductor device of FIG. 2A according to some embodiments of the present disclosure.
Figure 2C:
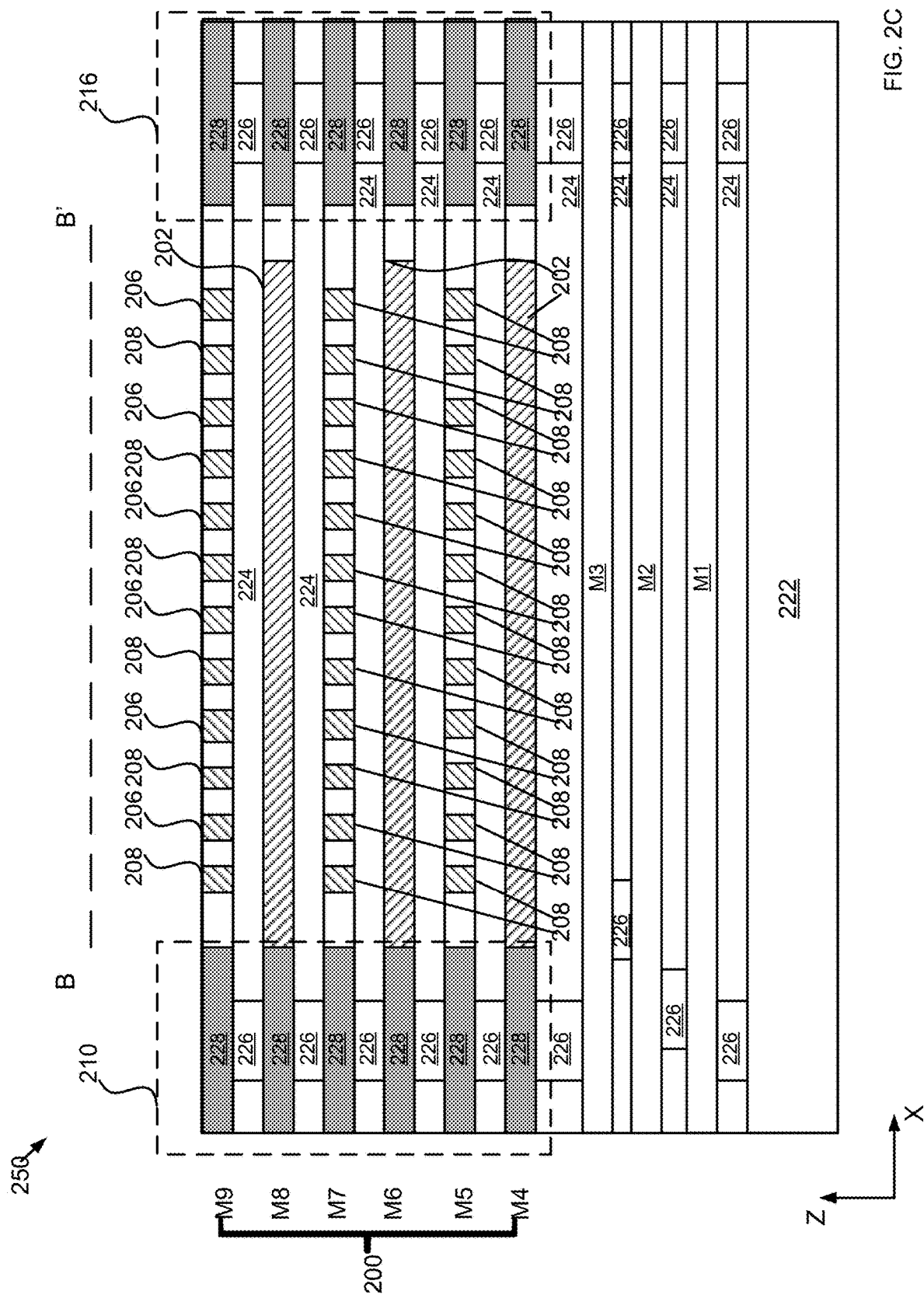
FIG. 2C is a block diagram illustrating another cross-sectional view of the semiconductor device of FIG. 2A according to some embodiments of the present disclosure.

In the example of FIGS. 2A, 2B, and 2C, the semiconductor device 250 includes a substrate 222. The substrate 222 may be a semiconductor substrate such as a silicon substrate. The substrate 222 may include various doping configurations depending on design requirements. The substrate 222 may also include other semiconductors such as germanium, silicon carbide (SiC), silicon germanium (SiGe), or diamond. Alternatively, the substrate may include a compound semiconductor and/or an alloy semiconductor. Further, the substrate 222 may optionally include an epitaxial layer (epi-layer), may be strained for performance enhancement, may include a silicon-on-insulator (SOI) structure, and/or have other suitable enhancement features. The semiconductor device 250 may include various devices formed in or on the substrate 222. Those devices may include active components such as Field Effect Transistors (FETs), Bipolar Junction Transistors (BJTs), and diodes, or passive components such as resistors, capacitors, and transformers. The semiconductor device 250 may include millions or billions of these devices.

As illustrated in FIGS. 2A, 2B, and 2C, an interconnect structure including a plurality of metal layers M1, M2, M3, M4, M5, M6, M7, M8, and M9 is formed over the substrate 222. The metal layers M1 through M9 may include metal lines formed of conductive materials such as aluminum, copper, aluminum/silicon/copper alloy, titanium, titanium nitride, tantalum, tantalum nitride, tungsten, polysilicon, other suitable conductive materials, or combinations thereof.

In some embodiments, inter-metal dielectric (IMD) layers 224 insulating the metal layers M1 through M9 from each other. In some embodiments, the IMD layers 224 at various levels of the interconnect structure may include different dielectric materials. IMD layers 224 with low-k (LK), extreme low-k (ELK), and/or extra low-k (XLK) materials may enhance circuit performance. The material classification may be based upon the value of a dielectric constant k. For example, LK materials may refer to those materials with a k value less than approximately 3.5, and preferably less than approximately 3.0. The ELK materials may refer to those materials with a k value less than approximately 2.9, and preferably less than approximately 2.6. The XLK materials may refer to those materials which typically have a k value less than approximately 2.4. Those classifications are mere examples and that other classifications based on the dielectric constant of the material may be utilized as well. The dielectric materials may comprise silicon nitride, silicon oxynitride, spin-on glass (SOG), undoped silicate glass (USG), fluorinated silica glass (FSG), carbon doped silicon oxide (e.g., SiCOH), carbon-containing material, polyimide, other proper porous polymeric materials, other suitable dielectric materials, and/or combinations thereof. In some embodiments, the IMD layers 224 include metal vias 226 connecting metal lines in different metal layers. The IMD layers 224 may be formed by techniques including spin-on, physical vapor deposition (PVD), chemical vapor deposition (CVD), or atomic layer deposition (ALD).

In some embodiments, the metal layers M1 through M9 and the IMD layers 224 may be formed in an integrated process such as a damascene process or lithography/plasma etching process.

In the example of FIGS. 2A, 2B, and 2C, the semiconductor device 250 includes a cell 200 including metal layers M4, M5, M6, M7, M8, and M9. Metal layers M4, M6, and M8 include metal lines (also referred to as fingers) 202 and 204 extending in the X direction according to the unidirectional restriction of the corresponding metal layers M4, M6, and M8. Metal layers M5, M7, and M9 include fingers 206 and 208 extending in the Y direction according to the unidirectional restriction of the corresponding metal layers M5, M7, and M9.

As illustrated in FIGS. 2A, 2B, and 2C, the cell 200 includes a bus 210 including a portion 212 extending in the X direction and a portion 214 extending in the Y direction. The cell 200 also includes a bus 216 including a portion 218 extending in the X direction and a portion 220 extending in the Y direction. Each of the buses 210 and 216 include metal lines 228 in the metal layers M4 through M9 and vias 226 in IMD layers 224 connecting those metal lines 228. In each of the even metal layers M4, M6, and M8, fingers 202 are connected to the bus 210 through the portion 214, and fingers 204 are connected to the bus 216 through the portion 220. In each of the odd metal layers M5, M7, and M9, fingers 206 are connected to the bus 210 through the portion 212, and fingers 208 are connected to the bus 216 through the portion 218.

In the example of FIGS. 2A, 2B, and 2C, the portions 212, 214 of the bus 210 and portions 218 and 220 of the bus 216 have the same width d2. However, in other examples, various portions of the buses 210 and 216 may have different widths. In addition, in the example, in the cell 200, each of the even metal layers M4, M6, and M8 include five fingers 202 and five fingers 204, and each of the odd metal layers M5, M7, and M9 include six fingers 206 and six fingers 208. However, in various embodiments, in each metal layer, the cell 200 may include any number of fingers 202, 204, 206, and 208. Further, in the illustrated example, each of the fingers 202, 204, 206, and 208 has a width d1 that is the same as the minimum metal pitch size. However, in other embodiments, those fingers may have different widths. In the particular example of FIGS. 2A, 2B, and 2C, each of the fingers 202, 204, 206, and 208 have a length-to-width ratio that is less than 20:1. However, in other embodiments, fingers having larger length-to-width ratios fingers may be used.

Figure 3:
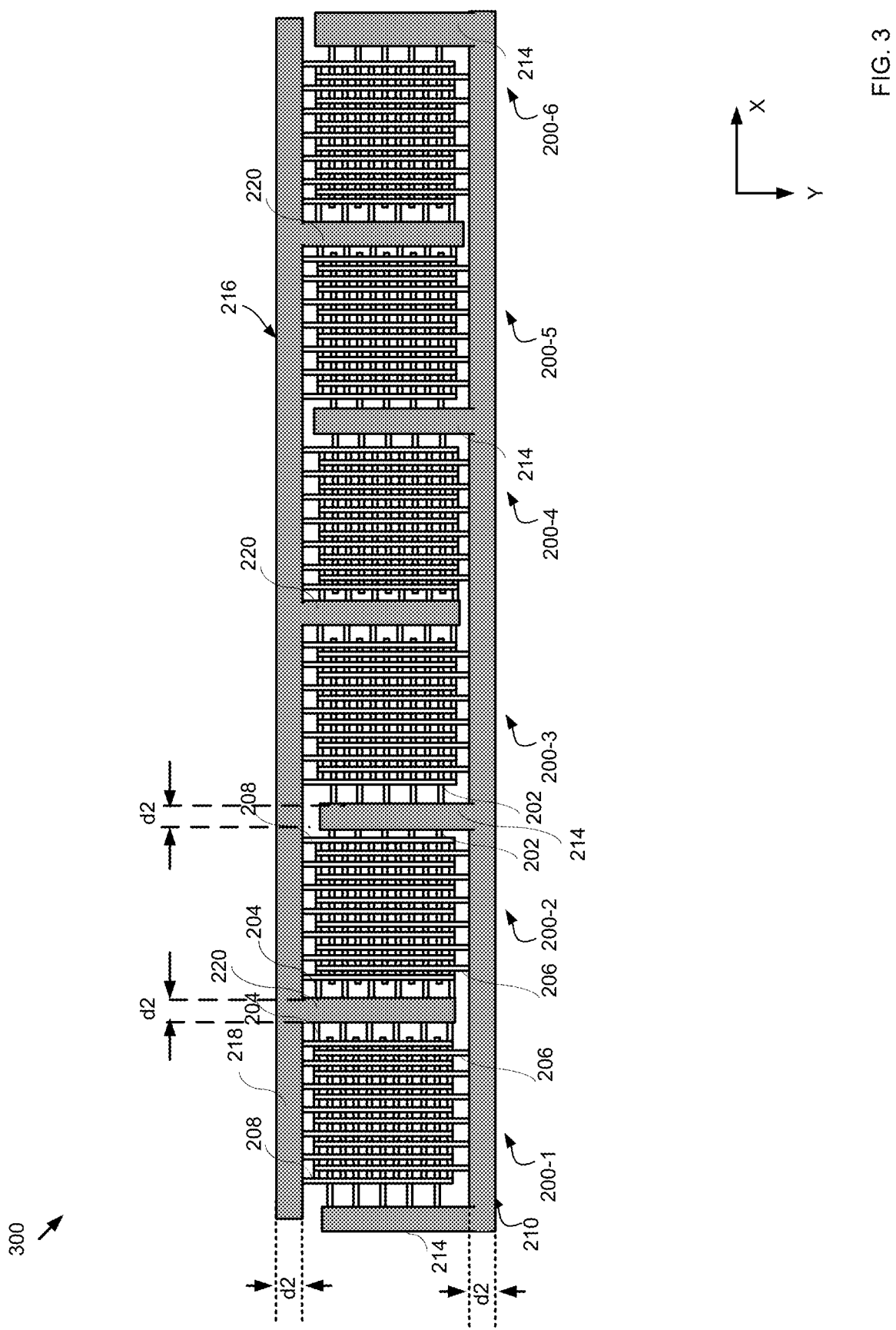
FIG. 3 is a block diagram illustrating a top view of a semiconductor device according to some embodiments of the present disclosure.

Referring to FIG. 3, in some embodiments, a finger capacitor may be formed by aligning the cells 200 in a row along the X direction or a column along the Y direction. By repeating the cells 200 to form a finger capacitor with a high capacitance, current may be forced to only pass through the wider buses which has much smaller parasitic resistance compared to the fingers. This may greatly reduce Q-degradation in a finger capacitor structure.

In the example of FIG. 3, a finger capacitor 300 is formed by aligning cells 200-1, 200-2, 200-3, 200-4, 200-5, and 200-6 in a row in the X direction. Portions of the buses 210 and 216 extending in the Y direction interpose adjacent cells. For example, a portion 214 of the bus 210 interposes cells 200-2 and 020-3, and another portion 214 of the bus 210 interposes cells 200-4 and 200-5. For further example, a portion 220 of the bus 216 interposes cells 200-1 and 200-2, and another portion 220 of the bus 216 interposes cells 200-3 and 200-4.

In some embodiments, in each of the even metal layers M4, M6, and M8, each of the portions of the buses 210 and 216 extending in the Y direction that interposes adjacent cells may connect to fingers of the adjacent cells. For example, in each of the even metal layers M4, M6, and M8, fingers 204 of the cell 200-1 connect to a portion 220 of the bus 216 by physically contacting the left sidewall of the portion 220, and fingers 204 of the cell 200-2 connect to the portion 220 by physically contacting the right sidewall of the portion 220. For further example, in each of the even metal layers M4, M6, and M8, fingers 202 of the cell 200-2 connect to a portion 214 of the bus 210 by physically contacting the left sidewall of that portion 214. Similarly, fingers 202 of the cell 200-3 connect to that portion 214 by physically contacting the right sidewall of that portion 214.

In the example of FIG. 3, while the portions 214 and 220 of the buses 210 and 216 connect to fingers of adjacent cells, the portions 214 and 220 may have a width d2 in the X direction. In some examples, when forming the finger capacitor 300 by repeating the cell 200 of FIG. 2A in a row, the portions 214 and 220 of adjacent cells overlap. As such, each of the portions 214 and 220 interposing adjacent cells has width d2 that is the same as the width d2 of portions 214 and 220 of the cell 200 of FIG. 2A. In those examples, by overlapping the portions of the buses of adjacent cells, finger capacity density is increased, which saves the total chip area of the finger capacity.

In the example of FIG. 3, the finger capacitor 300 includes a single row having six cells aligned in the X direction. In other embodiments, the row of the finger capacitor 300 may include any number of cells aligned in the X direction. Alternatively, in some embodiments, the finger capacitor 300 may include a column including any number of cells in the Y direction.

Figure 4A:
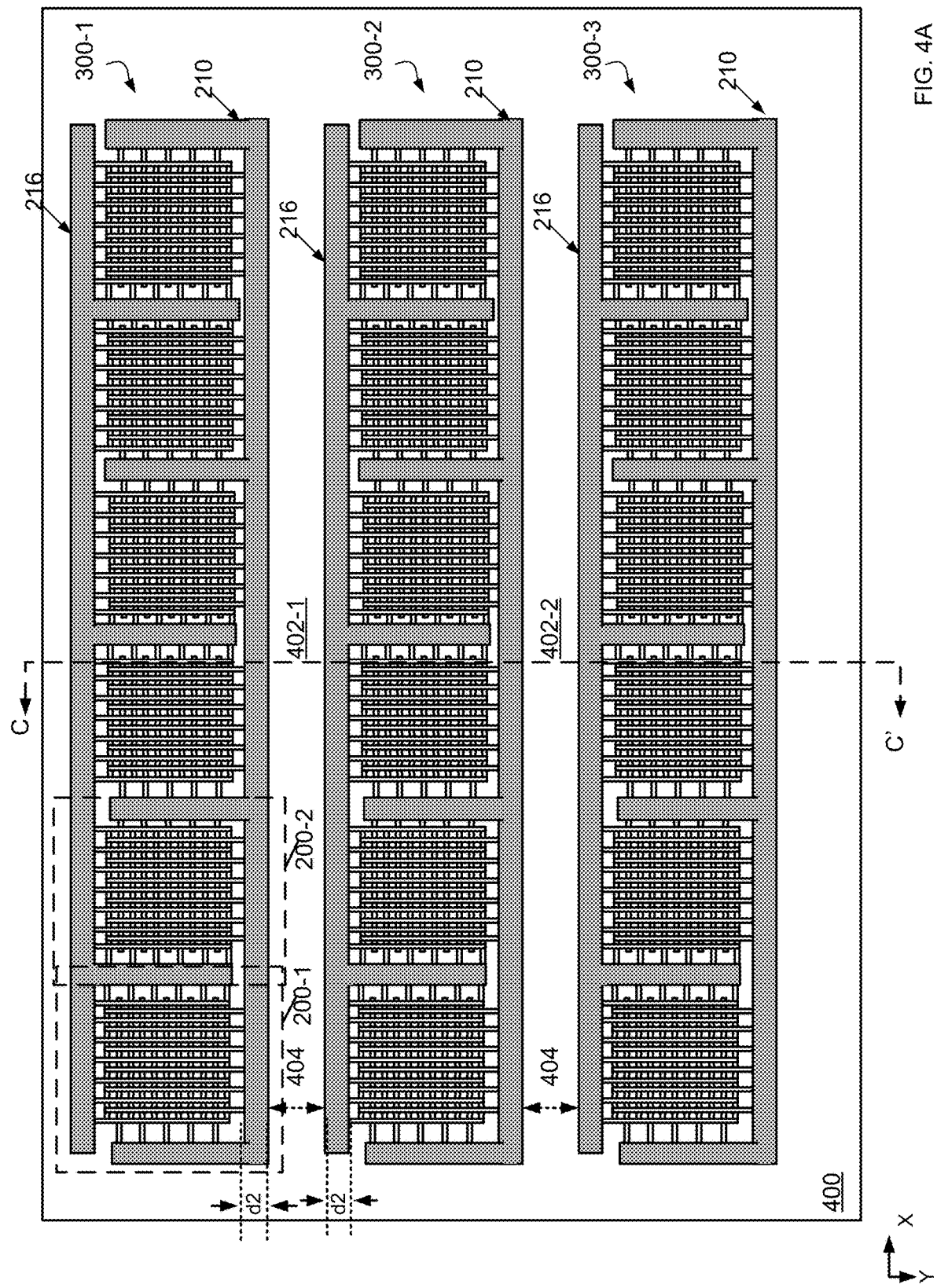
FIG. 4A is a block diagram illustrating a top view of a semiconductor device according to some embodiments of the present disclosure.

Referring to FIGS. 4A and 4B, in some embodiments, a finger capacitor 400 may include both rows and columns by aligning the cells 200 of FIG. 2 in rows in the X direction and columns in the Y direction. By aligning the cells in both the X direction and the Y direction, a finger capacitor 400 with a larger capacitance may be formed.

FIG. 4A illustrates a top view of the finger capacitor 400, and FIG. 4B illustrates a cross-sectional view of a portion (including rows 300-1 and 300-2) of the finger capacitor 400 along the line C-C'. In the example of FIGS. 4A and 4B, the finger capacitor 400 is formed by aligning rows 300-1, 300-2, and 300-3 (e.g., row 300 of FIG. 3) in the Y direction.

Each of the rows 300-1, 300-2, and 300-3 include six cells (e.g., cell 200 of FIG. 2A) aligned in direction X.

As illustrated in FIGS. 4A and 4B, there is a gap including dielectric materials between adjacent rows. For example, a gap 402-1 is disposed between rows 300-1 and 300-2, and a gap 402-2 is disposed between rows 300-2 and 300-3. Each of the gaps 402-1 and 402-2 has a gap width 404.

Figure 5B:
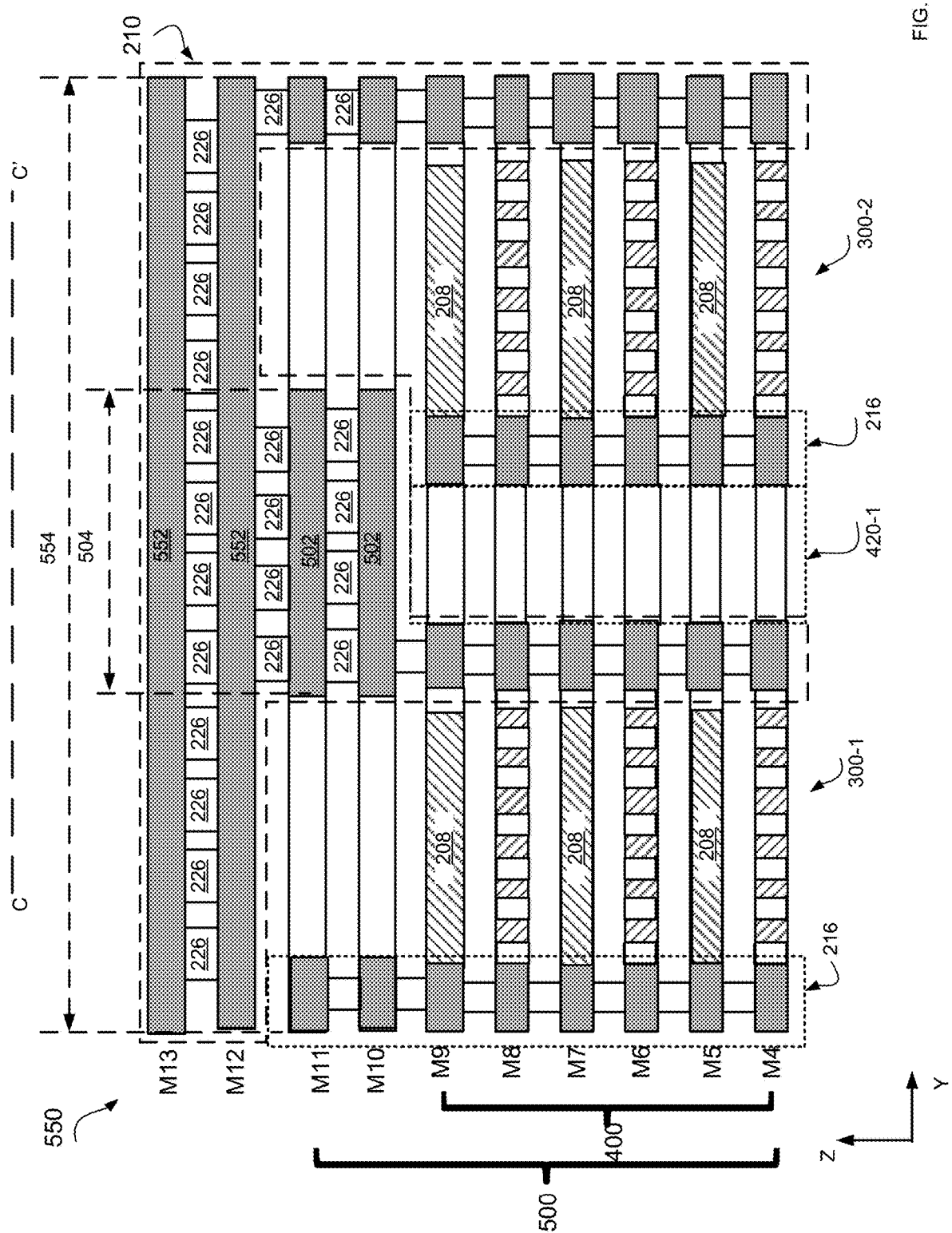
FIG. 5B is a block diagram illustrating a cross-sectional view of a semiconductor device or a portion thereof according to some embodiments of the present disclosure.

Referring to FIGS. 5A and 5B, in various embodiments, Q of a finger capacitor may be improved by expanding the width (e.g., along direction Y) and/or height (e.g., along direction Z) of one of the buses 210 and 216. By using a wider and thicker bus having a reduced series resistance, the Q of the finger capacitor 400 may be improved.

Referring to the example of FIG. 5A, illustrated is a cross-sectional view of a portion (including rows 300-1 and 300-2) of a finger capacitor 500. The finger capacitor 500 includes a finger capacitor 400 (e.g., a finger capacitor 400 of FIGS. 4A and 4B) and buses 210 and 216 connecting to the finger capacitor 400. As illustrated in FIG. 5A, the finger capacitor 500 may be formed by expanding the width and height of the bus 210 connecting to the finger capacitor 400 by using additional metal layers (e.g., metal layers M10 and M11) and fully populated vias 226 connecting these additional metal layers. The additional metal layers M10 and M11 are not used to form the fingers of the finger capacitor 400. Those additional metal layers M10 and M11 that are used to expand the bus 210 in width and/or height are shielded by the underlying metal layers. As such, those additional metal layers M10 and M11 may help reduce the parasitic resistance without adding extra parasitic capacitance.

In the example of FIG. 5A, the bus 210 includes metal lines 502 in metal layers M10 and M11, which are over the metal layers M4 through M9 for implementing the fingers of the finger capacitor 400. The metal layers M10 and M11 are not used to form fingers of the finger capacitor 400. The metal lines 502 of the bus 210 in the metal layers M10 and M11 have a width 504, which is greater than the combined width of the gap width 404 and twice the width d2 of the metal lines of the buses 210 and 216 in the underlying metal layers M4 through M9. In some examples, a top view area of the metal lines 502 of the bus 210 fully covers the combined top view area of the gap 402-1, the metal lines of the bus 210 of the row 300-1 in the underlying metal layers M4 through M9, and the metal lines of the bus 216 of the adjacent row 300-2 in the underlying metal layers M4 through M9.

Referring to FIG. 5B, in some embodiments, Q of a finger capacitor may be further improved by further expanding the top metal lines of one of the buses 210 and 216 (e.g., to cover the entire surface area of the finger capacitor). FIG. 5B illustrates is a cross-sectional view of a portion (including rows 300-1 and 300-2) of a finger capacitor 550. As illustrated in FIG. 5B, the finger capacitor 550 may be formed by expanding the width and height of the bus 210 connecting to a finger capacitor 400 (e.g., a finger capacitor 400 of FIGS. 4A and 4B) by using additional metal layers (e.g., metal layers M12 and M13) and fully populated vias 226 connecting these additional metal layers. Those additional metal layers M12 and M13 are not used to form the fingers of the finger capacitor 400.

In the example of FIG. 5B, the bus 210 includes metal lines 552 in the metal layers M12 and M13 and vias 226 connecting those metal lines 552. The metal line 552 may have a length 554 based on the total width of the surface area of the finger capacitor 400. In an example, the length 554 is the same as the total width of the surface area of the finger capacitor 400 so that the bus 210 does not extend beyond the surface area of the finger capacitor 400. As such, higher Q of the finger capacitor 400 is achieved without using any extra surface area of the chip. Further, those additional metal layers M13 and M14 used to expand the bus 210 in width and/or height are shielded by the underlying metal layers. As such, those additional metal layers M12 and M13 help reduce the parasitic resistance without adding extra parasitic capacitance.

Referring to FIG. 6, a method 600 for fabricating a finger capacitor is illustrated. The method 600 begins at block 602, where a first metal layer of a finger capacitor is formed, where the finger capacitor includes a plurality of cells. For example, at block 602, a metal layer M4 of a finger capacitor 400 may be formed over a substrate 222. As shown in the example of FIGS. 4A and 4B, the finger capacitor 400 includes a plurality (e.g., eighteen) of cells 200 aligned in three rows 300-1, 300-2, and 300-3. At block 602, for each cell 200 of the finger capacitor 400, the metal layer M4 includes interdigitated fingers 202 and 204. The fingers 202 are connected to the bus 216, and the fingers 204 are connected to the bus 210. In an example, each of the fingers 202 and 204 has a width d1 equal to the minimum metal pitch size. In that example, each of the fingers 202 and 204 extends along direction X according to a unidirectional requirement of the metal layer M4.

The method 600 may proceed to block 604, where a second metal layer of the finger capacitor is formed. For example, at block 604, a metal layer M5 is formed over the metal layer M4. As shown in the example of FIGS. 4A and 4B, at block 604, for each cell 200 of the finger capacitor 400, the metal layer M5 includes interdigitated fingers 206 and 208. The fingers 208 are connected to the bus 216, and the fingers 206 are connected to the bus 210. In an example, each of the fingers 206 and 208 has a width d1 equal to the minimum metal pitch size. In that example, each of the fingers 206 and 208 extends along direction Y according to a unidirectional requirement of the metal layer M5.

After block 604 and prior to block 606, the method 600 may form additional metal layers (e.g., M6, M7, M8, and M9) of the finger capacitor 400. Metal layers M6 and M8 are substantially similar to the metal layer M4, and metal layers M7 and M9 and substantially similar to the metal layer M5.

The method 600 may then proceed to block 606, where a third metal layer that includes portions of the buses but does not include the fingers of the capacitor is formed In the example of FIG. 5A, at block 606, a metal layer M10 is formed over the metal layer M5, and includes portions 502 of the bus 210. The metal layer M10 does not include fingers of the finger capacitor 400. Similarly, in the example of FIG. 5B, at block 606, a metal layer M12 is formed over the metal layer M5, and includes portions 552 of the bus 210. The metal layer M12 does not include fingers of the finger capacitor 400.

Figure 7:
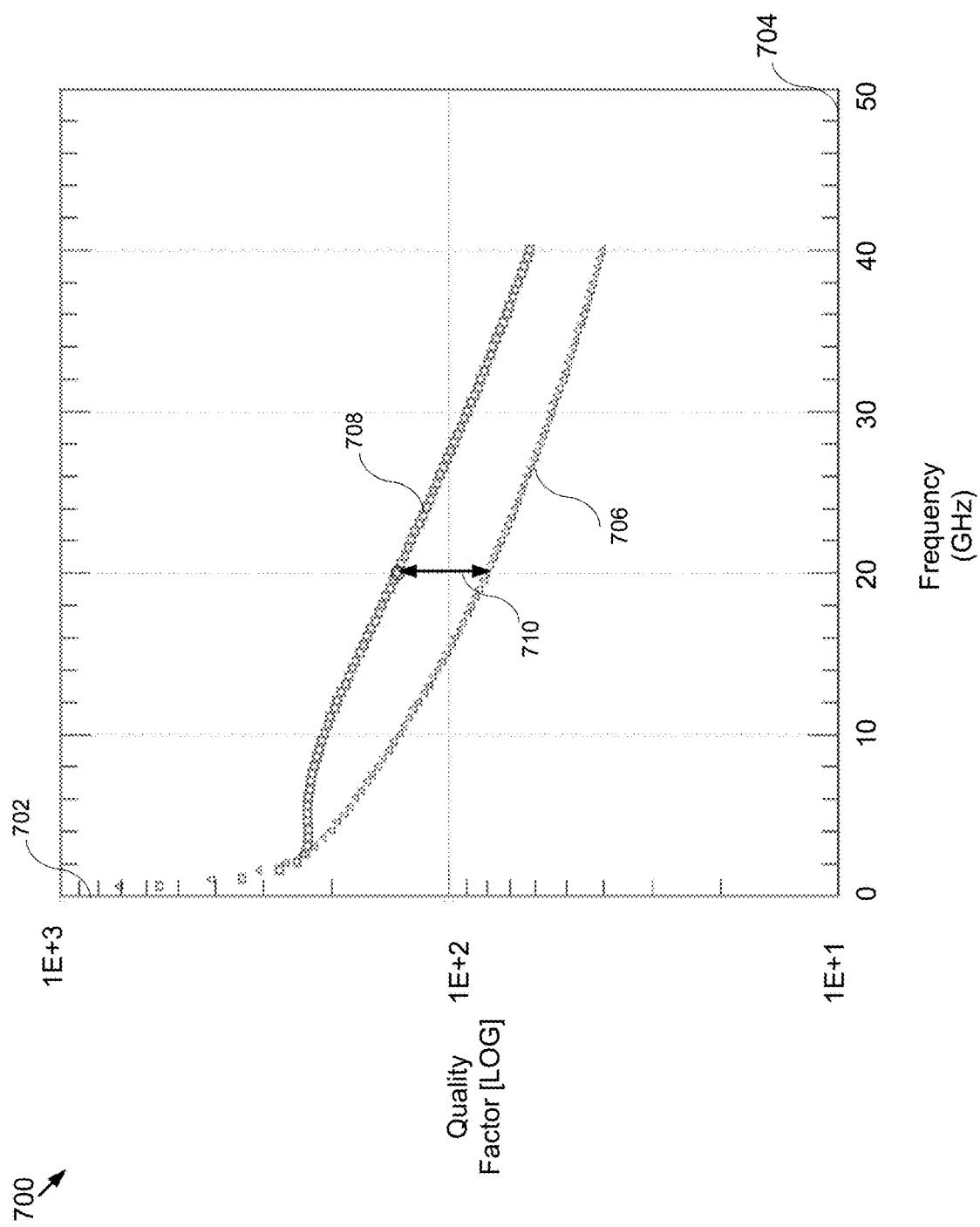
FIG. 7 is a graph depicting capacitor structure performance according to some embodiments of the present disclosure.

FIG. 7 is a graph 700 depicting capacitor structure performance according to an example implementation. An axis 702 represents Q on a logarithmic scale, and an axis 704 represents frequency on a linear scale. A curve 706 shows Q versus frequency for a typical metal finger capacitor. A curve 708 shows Q versus frequency for a finger capacitor 550 of FIG. 5B. As the frequency increases from 0 GHz to about 20 GHz, the improvement in Q between a typical metal finger capacitor and a finger capacitor 500 increases. For example, at 20 GHz, there is an improvement 710 (e.g., about 70%) in Q between a typical metal finger capacitor and a finger capacitor 550. As the frequency increases from 20 gigahertz (GHz) (e.g., between 20 GHz and 50 GHz), there remains to be about 70% improvement in Q between a typical metal finger capacitor and a finger capacitor 500. The graph 700 is merely an example, and the improvement in Q can depend on various factors and which the various exemplary implementations described herein is employed. In general, by using cells 200 to form a finger capacitor, a higher Q is achieved.

Figure 8A:
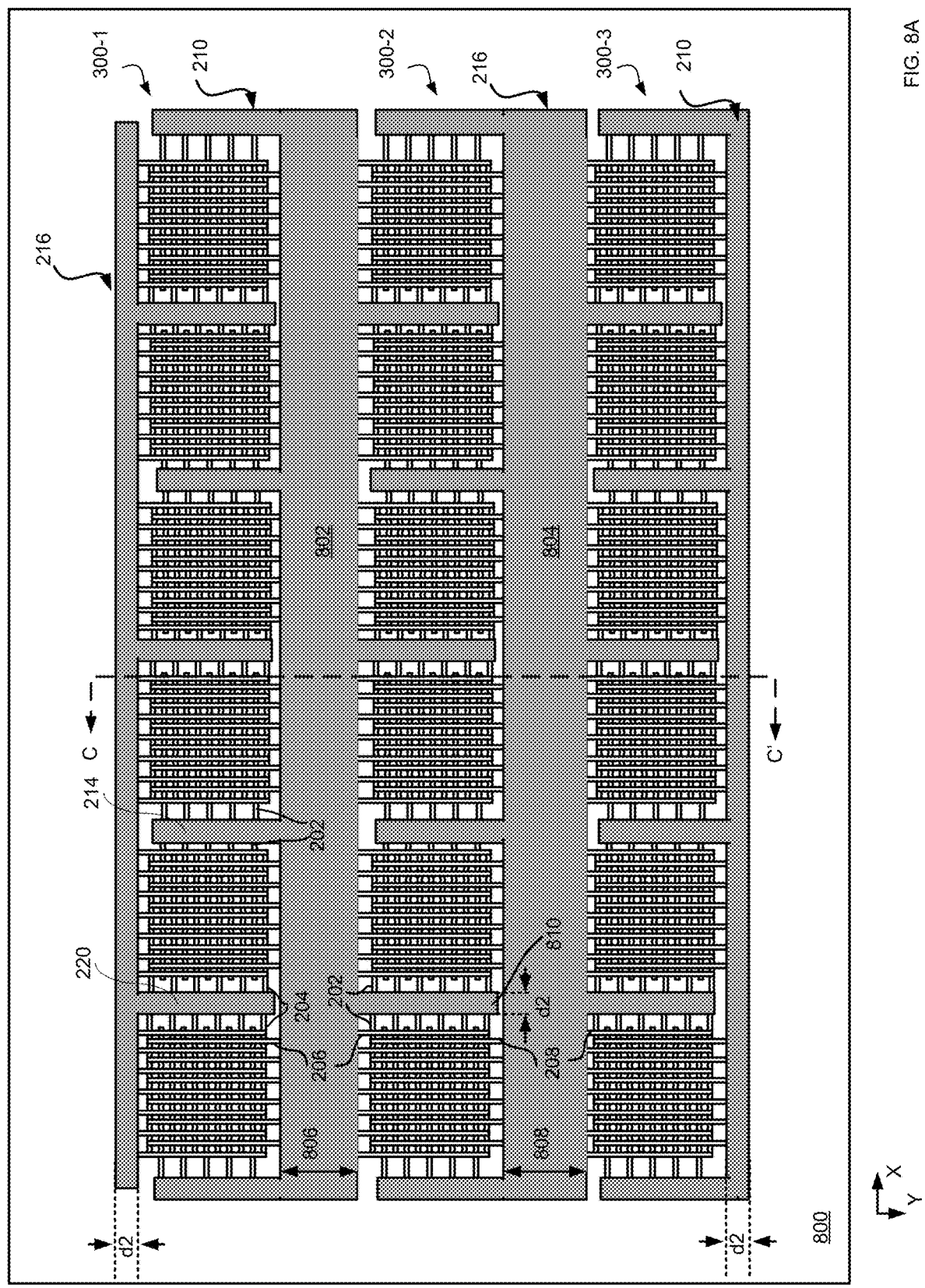
FIG. 8A is a block diagram illustrating a top view of a semiconductor device according to some embodiments of the present disclosure.
Figure 8B:
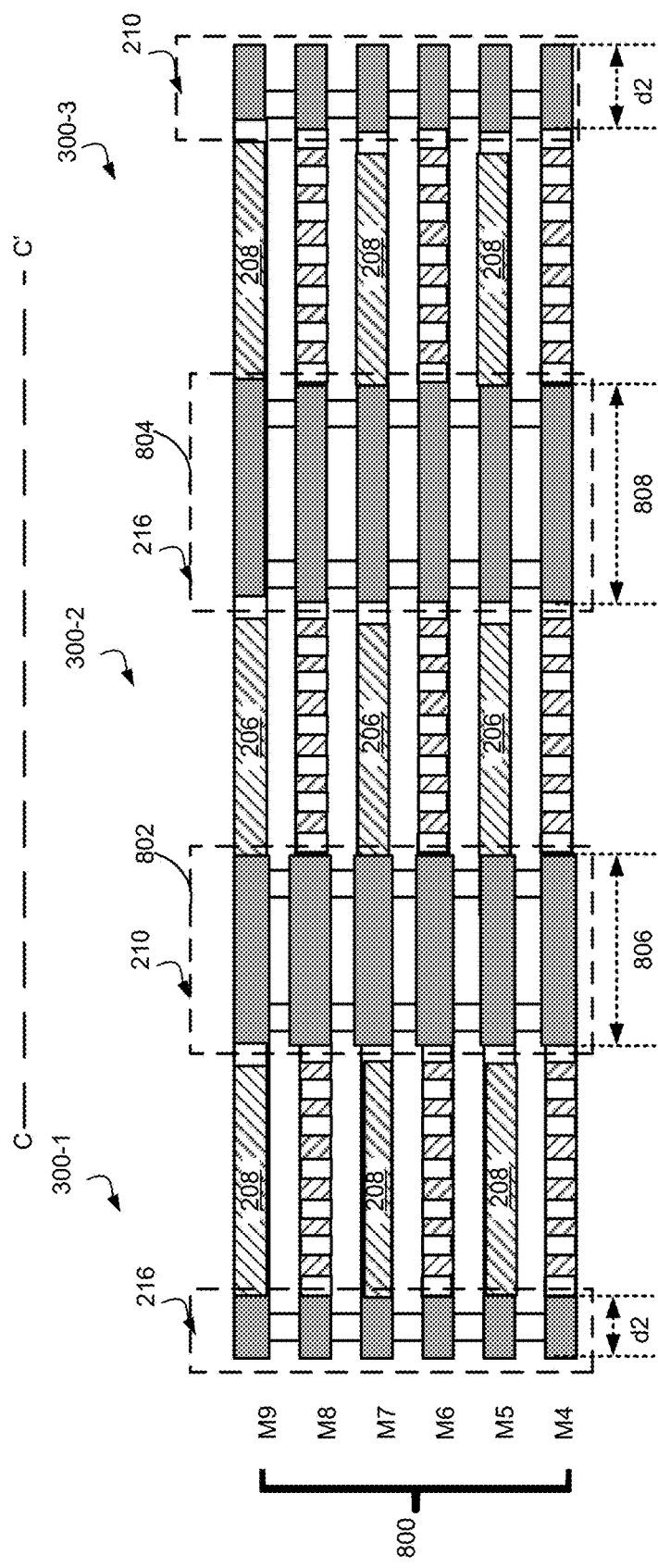
FIG. 8B is a block diagram illustrating a cross-sectional view of the semiconductor device of FIG. 8A according to some embodiments of the present disclosure.

Referring to FIGS. 8A and 8B, in some embodiments, a finger capacitor 800 may include both rows and columns by aligning the cells 200 of FIG. 2 in rows in the X direction and columns in the Y direction. Instead of having gaps between the adjacent rows, portions of buses may interpose adjacent rows and connect the adjacent rows. FIG. 8A illustrates a top view of the finger capacitor 800, and FIG. 8B illustrates a cross-sectional view of the finger capacitor 800 along the line C-C'. In the example of FIGS. 8A and 8B, the finger capacitor 800 is formed by aligning rows 300-1, 300-2, and 300-3 (e.g., row 300 of FIG. 3) in the Y direction. Each of the rows 300-1, 300-2, and 300-3 include six cells (e.g., cell 200 of FIG. 2A) aligned in the X direction.

In the example of FIGS. 8A and 8B, portions of buses interpose adjacent rows and connect the adjacent rows. Further, these portions of buses may have an expanded width (e.g., greater than the bus width d2 of FIG. 2A), and include metal lines in stacked metal layers (e.g., metal layers M4 through M9). Such buses with expanded widths and heights further improve the Q of the finger capacitor 800.

For example, a portion 802 of the bus 210 interposes adjacent rows 300-1 and 300-2, and connects those adjacent rows 300-1 and 300-2. The portion 802 has an expanded width 806 (e.g., equal to or greater than twice the bus width d2 of FIG. 2A) in the Y direction and connects rows 300-1 and 300-2. In an example, in the odd metal layers M5, M7, and M9, fingers 206 of the cells in the rows 300-1 and 300-2 are electrically coupled to the bus 210 by connecting to the portion 802 of the bus 210.

For further example, a portion 804 of the bus 216 interposes adjacent rows 300-2 and 300-3, and connects those adjacent rows 300-2 and 300-3. The portion 804 has an expanded width 808 (e.g., equal to or greater than twice the bus width d2 of FIG. 2A) in the Y direction and connects rows 300-2 and 300-3. In the odd metal layers M5, M7, and M9, fingers 208 of the cells in the rows 300-2 and 300-3 are electrically coupled to the bus 216 by connecting to the portion 804 of the bus 216. The widths 806 and 808 have the same value or have different values.

In the example of FIGS. 8A and 8B, in each row, portions of the buses 210 and 216 interpose adjacent cells in the same row. For example, a portion 220 of the bus 216 interposes two adjacent cells of the row 300-1. The portion 220 may have a width d2, which is greater than the minimum metal line pitch. In the even metal layers M4, M6, and M8, fingers 204 of the cells in the row 300-2 are electrically coupled to the bus 216 by connecting to the portion 220 of the bus 216. A portion 214 of the bus 210 may interpose the next two adjacent cells of the row 300-1. In the even metal layers M4, M6, and M8, fingers 202 of the cells in the row 300-1 are electrically coupled to the bus 210 by connecting to the portion 214 of the bus 210. For further example, a portion 810 of the bus 210 interposes adjacent cells of the row 300-2. The portion 810 may have a width d2, which is greater than the minimum metal line pitch. In the even metal layers M4, M6, and M8, fingers 202 of the cells in the row 300-2 are electrically coupled to the bus 210 by connecting to the portion 810 of the bus 210.

Figure 9:
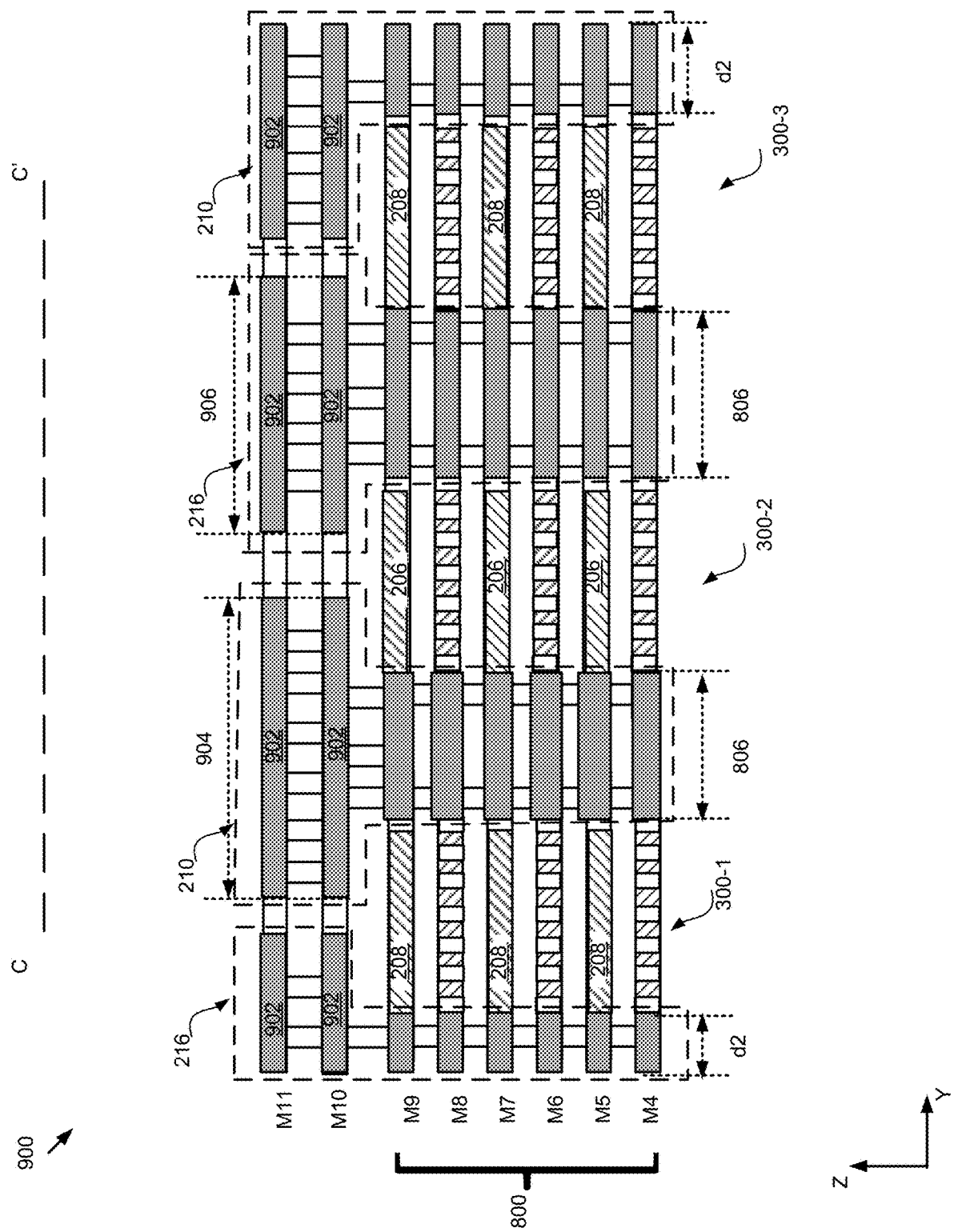
FIG. 9 is a block diagram illustrating a cross-sectional view of a semiconductor device or a portion thereof according to some embodiments of the present disclosure.

Referring to FIG. 9, in some embodiments, both buses 210 and 216 are further expanded in width (e.g., in a direction (e.g., direction X and/or Y) parallel to a top surface of the substrate 222) and thickness (e.g., in a direction Z perpendicular to a top surface of the substrate 222). Such expansion may be achieved by implementing the buses using additional metal layers that are not used to form the fingers of the finger capacitor 800 and fully populated vias connecting these additional metal layers. By using wider and thicker buses that have reduced series resistance, the Q of the finger capacitor is improved.

In the example of FIG. 9, a device 900 includes a finger capacitor 800 (e.g., a finger capacitor 800 of FIGS. 8A and 8B) and buses 210 and 216 connecting to the finger capacitor 800. The buses 210 and 216 include metal lines 902 in metal layers M10 and M11, which are over the metal layers M4 through M9 for implementing the fingers of the finger capacitor 800. As illustrated in FIG. 9, the metal lines 902 of the bus 210 in the metal layers M10 and M11 have a width 904, and the metal lines 902 of the bus 216 in the metal layers M10 and M11 have a width 906. Each of the widths 904 and 906 may be greater than the widths 806 of the metal lines of the buses 210 and 216 in the underlying metal layers M4 through M9. In an example, the widths 904 and 906 of the metal lines of the buses 210 and 216 in the metal layers M10 and M11 respectively have the same value. In another example, the widths 904 and 906 are different.

In some examples, the width expansion of the buses 210 and 216 fully utilizes the surface area of the finger capacitor 800 without extending beyond the surface area of the finger capacitor. As such, higher Q is achieved without using any extra surface area of the chip. Further, in some examples, those additional metal layers M10 and M11 used to expand the buses 210 and 216 in width and height are shielded by the underlying metal layers (e.g., metal layers M1 through M3, and M4 through M9 that are used to form the fingers of the finger capacitor). As such, those additional metal layers help reduce the parasitic resistance without adding extra parasitic capacitance.

It is noted that various configurations (e.g., metal layers M4 through M9 of the finger capacitor, additional metal layers M10, M11, M12, and M13 of the buses, the number of rows and/or columns in the finger capacitor, the number of cells in each row and/or column of the finger capacitor, the number of fingers in each cell) illustrated in FIGS. 2A through 9 are exemplary only and not intended to be limiting beyond what is specifically recited in the claims that follow. It will be understood by those skilled in that art in possession of this disclosure that other configurations may be used.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A capacitor, comprising:
   a first metal layer over a substrate;
   a second metal layer over the first metal layer;
   a first cell electrically coupled to a first bus and a second bus, the first cell including:
   a first plurality of fingers in the first metal layer extending in a first direction parallel to a top surface of the substrate and electrically coupled to the first bus;

a second plurality of fingers in the first metal layer extending in the first direction and electrically coupled to the second bus;
a third plurality of fingers in the second metal layer extending in a second direction parallel to the top surface of the substrate and electrically coupled to the first bus, the second direction being different from the first direction; and
a fourth plurality of fingers in the second metal layer extending in the second direction and electrically coupled to the second bus;
a second cell electrically coupled to the first bus and the second bus, the second cell including:
a fifth plurality of fingers in the first metal layer extending in the first direction and electrically coupled to the second bus;
a sixth plurality of fingers in the first metal layer extending in the first direction and electrically coupled to the first bus;
a seventh plurality of fingers in the second metal layer extending in the second direction and electrically coupled to the second bus; and
an eighth plurality of fingers in the second metal layer extending in the second direction and electrically coupled to the first bus; and
a third metal layer over the second metal layer, wherein the third metal layer includes:
a first metal line of the first bus disposed over at least a portion of the sixth plurality of fingers of the second cell;
a second metal line of the second bus disposed over at least a portion of the second plurality of fingers of the first cell and at least a portion of the fifth plurality of fingers of the second cell; and
a gap disposed between the first and second metal lines, wherein each of the first and second metal lines has a width greater than a distance between the first cell and the second cell in the second metal layer.

2. The capacitor of claim 1, further comprising:
a first row including the first cell and a third cell aligned in the first direction, wherein a first portion of the first bus interposes the first and third cells.

3. The capacitor of claim 2, wherein each finger of the first plurality of fingers of the first cell physically contacts one of two opposing sidewalls of the first portion of the first bus, and wherein each finger of an ninth plurality of fingers of the third cell physically contacts the other of the two opposing sidewalls of the first portion of the first bus.

4. The capacitor of claim 2, further comprising a second row including the second cell and a fourth cell aligned in the first direction, wherein a first portion of the second bus interposes the second and fourth cells, wherein each finger of the sixth plurality of fingers of the second cell-physically contacts one of two opposing sidewalls of the first portion of the second bus, and wherein each finger of a tenth plurality of fingers of the fourth cell physically contacts the other of the two opposing sidewalls of the first portion of the second bus.

5. The capacitor of claim 4,
wherein the second row is aligned with the first row in the second direction.

6. The capacitor of claim 5, wherein a second portion of the second bus interposes the first row and the second row.

7. The capacitor of claim 5, wherein the second metal line is disposed directly over a gap between the first row and the second row.

8. The capacitor of claim 7, wherein the second metal line is disposed directly the first, second, third, and fourth cells.

9. The capacitor of claim 1, wherein a width of the first metal line is different from a width of the second metal line.

10. The capacitor of claim 1, wherein each finger of the first cell and the second cell has a first width equal to a minimum metal line width for fabrication of the capacitor.

11. The capacitor of claim 10, wherein a distance between first and second fingers of the first plurality of fingers is equal to a minimum spacing size for the fabrication of the capacitor.

12. The capacitor of claim 10, wherein a first portion of the first bus interposing the first and second cells has a second width greater than the first width.

13. The capacitor of claim 1, wherein in the first cell, each of a first total number of the first plurality and second plurality of fingers and a second total number of the third plurality and fourth plurality of fingers is less than 10.

14. The capacitor of claim 1, further comprising:
a fourth metal layer over the third metal layer, wherein the fourth metal layer includes:
a third metal line of the one of the first and second buses and a fourth metal line of the other of the first and second buses; and
a gap disposed between the third and fourth metal lines in the fourth metal layer.

15. A capacitor, comprising:
a plurality of cells electrically coupled to first and second buses, the plurality of cells comprising:
a first cell electrically coupled to the first bus and the second bus, the first cell including:
a first plurality of fingers in a first metal layer over a substrate extending in a first direction parallel to a top surface of the substrate and electrically coupled to the first bus;
a second plurality of fingers in the first metal layer extending in the first direction and electrically coupled to the second bus;
a third plurality of fingers in a second metal layer over the first metal layer extending in a second direction parallel to the top surface of the substrate and electrically coupled to the first bus, the second direction being different from the first direction; and
a fourth plurality of fingers in the second metal layer extending in the second direction and electrically coupled to the second bus;
a second cell electrically coupled to the first bus and the second bus, the second cell including:
a fifth plurality of fingers in the first metal layer extending in the first direction and electrically coupled to the second bus;
a sixth plurality of fingers in the first metal layer extending in the first direction and electrically coupled to the first bus;
a seventh plurality of fingers in the second metal layer extending in the second direction and electrically coupled to the second bus; and
an eighth plurality of fingers in the second metal layer extending in the second direction and electrically coupled to the first bus; and
a third metal layer over the second metal layer, wherein the third metal layer includes:
a first metal line of the first bus disposed over at least a portion of the sixth plurality of fingers;

a second metal line of the second bus disposed over at least a portion of the second plurality of fingers and the fifth plurality of fingers; and a gap disposed between the first and second metal lines.

16. The capacitor of claim 15, wherein the plurality of cells further comprises:

a third cell, and wherein the first cell and the third cell are disposed in a first row and are aligned in the first direction, wherein the first bus interposes the first and third cells.

17. The capacitor of claim 16, wherein each finger of the first plurality of fingers of the first cell physically contacts one of two opposing sidewalls of the first bus, and wherein each finger of a ninth plurality of fingers of the third cell physically contacts the other of the two opposing sidewalls of the first bus.

18. The capacitor of claim 16, wherein the plurality of cells further comprises a fourth cell, wherein the second cell and the fourth cell are disposed in a second row and are aligned in the first direction, wherein the second bus interposes the second and fourth cells, wherein each finger of the sixth plurality of fingers of the second cell physically contacts one of two opposing sidewalls of the second bus, and wherein each finger of a tenth plurality of fingers of the fourth cell physically contacts the other of the two opposing sidewalls of the second bus.

19. The capacitor of claim 18, wherein the second row is aligned with the first row in the second direction.

20. The capacitor of claim 19, wherein the second bus interposes the first row and the second row.

21. A capacitor, comprising:

a first metal layer over a substrate;

a second metal layer over the first metal layer;

a third metal layer over the second metal layer;

a first bus comprising:
- a first metal line and a second metal line in the first metal layer;
- a third metal line and a fourth metal line in the second metal layer; and
- a fifth metal line in the third metal layer and disposed over at least a portion of the second metal line and the fourth metal line;

a second bus comprising:
- a sixth metal line in the first metal layer;
- a seventh metal line in the second metal layer; and
- an eighth metal line in the third metal layer and disposed over at least a portion of the sixth metal line and the seventh metal line;

first fingers in the first metal layer extending in a first direction parallel to a top surface of the substrate and contacting the first metal line of the first bus;

second fingers in the first metal layer extending in the first direction and contacting a first sidewall of the sixth metal line of the second bus, the first fingers are interdigitated with the second fingers;

third fingers in the first metal layer extending in the first direction and contacting a second sidewall opposite from the first sidewall of the sixth metal line of the second bus;

fourth fingers in the first metal layer extending in the first direction and contacting the second metal line of the first bus, the fourth fingers are interdigitated with the third fingers;

fifth fingers in the second metal layer extending in a second direction parallel to the top surface and contacting the third metal line of the first bus, the second direction being different from the first direction;

sixth fingers in the second metal layer extending in the second direction and connected to the seventh metal line of the second bus, the sixth fingers are interdigitated with the fifth fingers;

seventh fingers in the second metal layer extending in the second direction and connected to the seventh metal line of the second bus; and eighth fingers in the second metal layer extending in the second direction and connected to the fourth metal line of the first bus, the eighth fingers are interdigitated with the seventh fingers, wherein the fifth metal line is disposed over at least a portion of the fourth fingers and the eighth fingers, and the eighth metal line is disposed over at least a portion of the second fingers, and the third fingers.

* * * * *

UNITED STATES PATENT AND TRADEMARK OFFICE
CERTIFICATE OF CORRECTION

PATENT NO. : 10,847,604 B1
APPLICATION NO. : 15/707552
DATED : November 24, 2020
INVENTOR(S) : Jing Jing et al.

Page 1 of 1

It is certified that error appears in the above-identified patent and that said Letters Patent is hereby corrected as shown below:

In the Claims

Column 16, Line 2, In Claim 8, after "directly" insert -- over --.

Signed and Sealed this
Twenty-second Day of June, 2021

Drew Hirshfeld
*Performing the Functions and Duties of the
Under Secretary of Commerce for Intellectual Property and
Director of the United States Patent and Trademark Office*